United States Patent [19]
Nelson

[11] Patent Number: 5,455,510
[45] Date of Patent: Oct. 3, 1995

[54] SIGNAL COMPARISON CIRCUIT WITH TEMPERATURE COMPENSATION

[75] Inventor: Richard W. Nelson, Freeport, Ill.

[73] Assignee: Honeywell Inc., Minneapolis, Minn.

[21] Appl. No.: 212,527

[22] Filed: Mar. 11, 1994

[51] Int. Cl.[6] .................................................. G01R 31/02
[52] U.S. Cl. ........................................ 324/252; 327/513
[58] Field of Search ................................... 324/251, 252, 324/225, 207.91, 207.20, 207.12, 224; 327/511, 513; 338/32 H, 32 R

[56] References Cited

U.S. PATENT DOCUMENTS

| 4,506,217 | 3/1985 | Rothley et al. | |
|---|---|---|---|
| 4,521,727 | 6/1985 | Atherton et al. | 323/294 |
| 4,908,527 | 3/1990 | Van Antwerp | 324/251 |
| 4,914,387 | 4/1990 | Santos | 324/252 |
| 4,966,041 | 10/1990 | Miyazaki | 338/32 H X |
| 5,055,768 | 10/1991 | Plagens | 324/225 X |
| 5,231,351 | 7/1993 | Kordts et al. | 324/207.21 X |

Primary Examiner—Sandra L. O'Shea
Assistant Examiner—Roger Phillips
Attorney, Agent, or Firm—William D. Lanyi

[57] ABSTRACT

A signal comparison circuit is provided which exhibits a change in its hysteresis as a function of changing temperature. The change in the hysteresis is accomplished by arranging first and second transistors in association with each other and in association with a feedback resistor of a comparator. The known variation in base-emitter voltage drop of transistors as a function of changing temperature is taken advantage of by the comparison circuit and the voltage at the feedback resistor of a comparator is changed as a function of temperature change. As a result, the hysteresis is decreased as a result of increasing temperature and increased as a result of decreasing temperature so that changes in signal magnitude of first and second input signals does not adversely affect the ability of the circuit to respond to changes in the difference between the first and second input signals and properly provide an output signal at the correct time. This characteristic is particularly advantageous in applications, such as automotive applications, which must operate consistently regardless of wide temperature fluctuations.

20 Claims, 7 Drawing Sheets

SIGNAL COMPARISON CIRCUIT WITH TEMPERATURE COMPENSATION

BACKGROUND OF THE INVENTION

1. Field of the Invention

The present invention is generally related to a voltage comparison circuit with temperature compensation capability and, more particularly, to a circuit that utilizes the inherent temperature variation of the base-emitter voltage drop of transistors to regulate the feedback of a comparator and therefore change the hysteresis characteristics of the comparison circuit as a predictable function of temperature.

2. Description of the Prior Art

Voltage comparison circuits are used in many different applications that are well known to those skilled in the art. One application for voltage comparison circuits of this type is in a geartooth sensor that utilizes a plurality of magnetoresistors that are connected in a Wheatstone bridge arrangement. For example, four magnetoresistors can be arranged in a bridge configuration so that the voltage differential across the bridge is indicative of the presence or absence of a magnetic component, such as a geartooth, in a predefined detection zone proximate the geartooth sensor.

U.S. patent application No. 08/179,800 (M10-15537), which was filed by Wu on Jan. 11, 1994, describes a proximity sensor that provides two magnetoresistive elements that are disposed in a common plane and displaced from a lateral surface of a permanent magnet. The common sensing plane of the magnetoresistive elements extends in a direction generally parallel to a magnetic axis of a permanent magnet that extends between the north and south poles of the magnet. A detection zone is defined relative to a preselected magnetic pole face and the magnetoresistive elements provide first and second signals that can be compared to define a third signal which is representative of the presence or absence of the magnetically permeable object within the detection zone. The magnetoresistive element can each comprise a plurality of magnetoresistors which are arranged in a Wheatstone bridge configuration for the purpose of providing the first and second signals described above.

U.S. Pat. No. 4,506,217, which issued to Rothley et al on Mar. 19, 1985, discloses a geartooth position and speed sensor with four magnetic resistance tracks. In order to simplify a speed and position sensor, four meander-arranged permalloy resistance tracks are located on a substrate at the corners of a rectangle. They are spaced in circumferential direction by approximately half the pitch distance of the teeth of a starter gear. The resistances can be connected in a voltage divider configuration or in the form of a bridge circuit supplied from a constant current source to eliminate temperature variation effects.

When a magnetic sensor is used to detect the presence or absence of a magnetic object within its detection zone, it is very important that the sensor's ability to identify the position of a geartooth is not adversely affected by changes in temperature. When a geartooth sensor is utilized in automotive applications, the large temperature range under which the sensor must function can present severe problems. These problems are particularly troublesome in automotive applications because changes in temperature may change the sensor's ability to determine the precise position of a rotating member that is required for proper timing and operation of the automotive engine.

It would therefore be significantly beneficial if a voltage comparison circuit could be provided which changes its own operation characteristics in response to changes in temperature so that the precise position of a rotating gear can be determined accurately throughout a large temperature range.

SUMMARY OF THE INVENTION

In a preferred embodiment of the present invention, a circuit comprises first and second means for receiving first and second input signals, respectively. Although the circuit of the present invention can be utilized in association with many different types of monitoring devices, one particularly preferred embodiment of the present invention is associated with a Wheatstone bridge that comprises four magnetoresistors. The first and second input signals received by the present invention are provided from two midpoints of opposite legs of a Wheatstone bridge. The circuit of the present invention also comprises a means for determining a difference between the first and second input signals. It also includes a first means for comparing that difference to a first threshold magnitude and a second means for comparing that difference to a second threshold magnitude.

In certain applications of magnetoresistors arranged in a Wheatstone bridge configuration, the difference between the first and second input signals varies from a positive magnitude to a negative magnitude as the two input signals change in response to movement of a magnetic object through the detection zone of a geartooth sensor. The first and second threshold magnitudes are typically used to define a hysteresis characteristic therebetween. Although the varying difference between the first and second input signals can resemble a sinusoidal waveform, it should be understood that most applications of a geartooth sensor would typically provide a difference between the first and second input signals that is not precisely sinusoidal in shape.

The present invention also comprises a means for decreasing the first threshold magnitude as a function of increasing temperature and a means for increasing the second threshold magnitude as a function of increasing temperature.

In a preferred embodiment of the present invention, the determining means and the first and second comparing means comprise a first comparator. In addition, the first and second providing means of the present invention comprise a second comparator. A feedback resistor is connected between an output and a noninverting input of the first comparator in a preferred embodiment of the present invention. The decreasing means comprises a first transistor connected in signal communication with the feedback resistor and the increasing means comprises a second transistor connected in signal communication with the feedback resistor. In a preferred embodiment of the present invention, the emitter of the first transistor is connected to the emitter of the second transistor and the feedback resistor is connected in signal communication with the emitters of the first and second transistors. A voltage divider is provided and connected between a voltage source and a point of ground potential. A base of the first transistor is connected to a first point of the voltage divider and a base of the second transistor is connected to a second point of the voltage divider.

In one alternative embodiment of the present invention, four magnetoresistors are connected in a Wheatstone bridge arrangement and the first input signal is taken from the first leg of the bridge. The second input signal is taken from a second leg of the bridge. In one particularly preferred embodiment of the present invention, the four magnetoresistors are made of a permalloy material.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Throughout the Description of the Preferred Embodiment, like components will be identified by like reference numerals.

Figure 1:
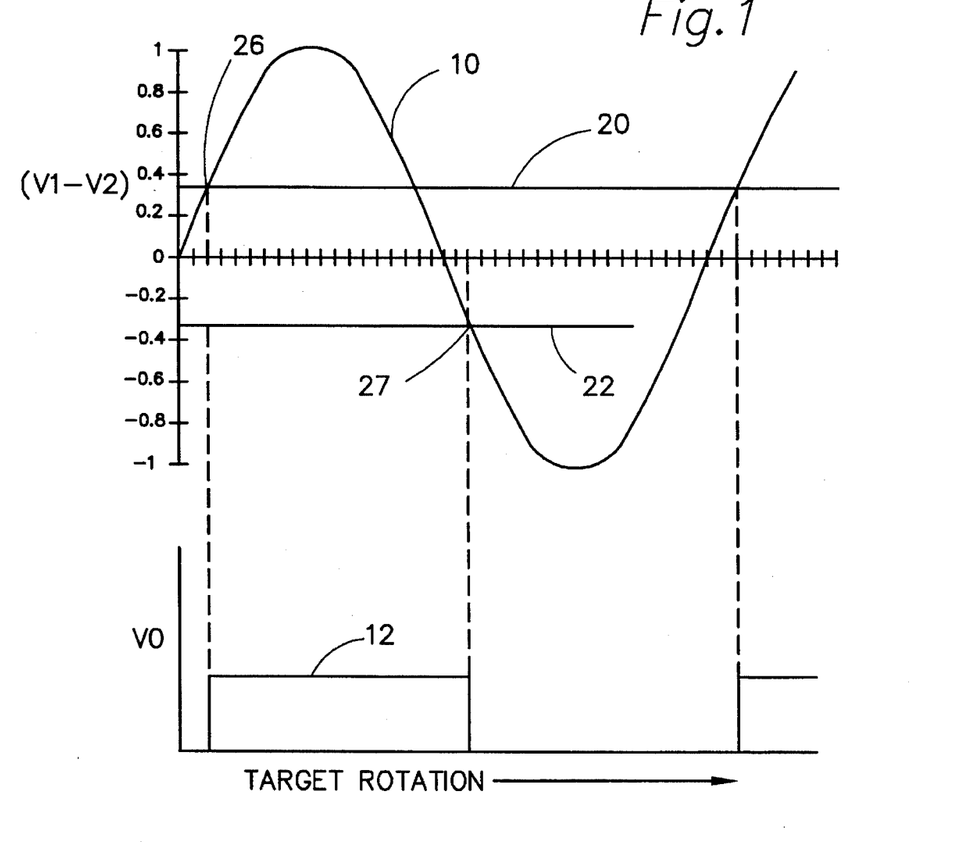
FIG. 1 shows a graphical representation of the change in the difference between first and second input signals and the relationship of this difference to an output signal.
Figure 2:
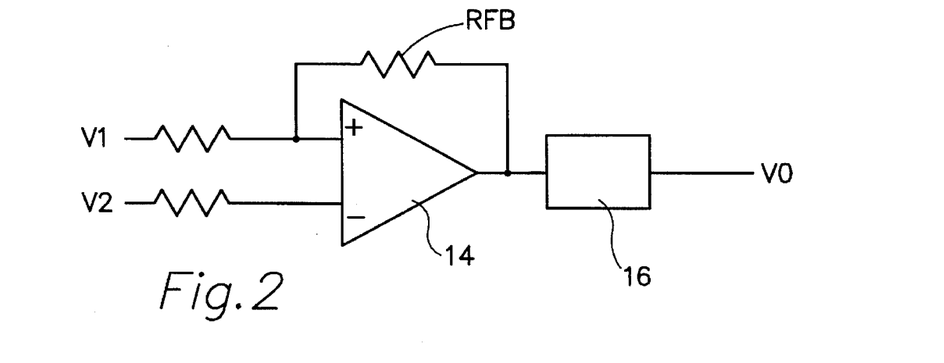
FIG. 2 shows a highly schematic illustration of a circuit that can provide the signals shown in FIG. 1.

FIG. 1 illustrates a waveform 10 which represents the difference in magnitude between a first input signal V1 and a second input signal V2. FIG. 1 also shows a signal 12 that represents the output signal V0 that is determined by comparing the waveform 10 to predefined threshold magnitudes. FIG. 2 is a highly schematic representation of a comparator 14 that can be used to compare two input signals, V1 and V2, and provide a signal to a device 16 that compares the output signal from the comparator 14 to a predetermined magnitude and provides the output signal V0. As will be described in greater detail below, a more complex circuit is used by the present invention to provide the output signal V0, but the simplified schematic shown in FIG. 2 is intended to facilitate the description of the problems that can exist in comparison circuits of this general type.

In FIG. 1, a first threshold magnitude 20 and a second threshold magnitude 22 are provided for comparison to the changing magnitude of waveform 10. When the magnitude of waveform 10 exceeds the first threshold magnitude 20, as it does at point 26, the output signal V0 is provided by device 16. By using a feedback resistor RFB, the second threshold magnitude 22 can be set so that output signal V0 does not return to zero until the magnitude of waveform 10 is less than the second threshold magnitude 22. The pattern shown in FIG. 1 can represent the movement of a series of teeth and slots of a gear through the detection zone of a geartooth sensor. The presence of a positive output signal V0 would then represent the presence of a tooth within the detection zone. It is important to provide the output signal V0 at the precise time when a tooth reaches a preselected location within the detection zone and then to remove the output signal V0 at a precise time when the tooth leaves a predetermined location within the detection zone. Variation in the timing of the output signal can adversely affect the operation of an internal combustion engine.

Figure 3:
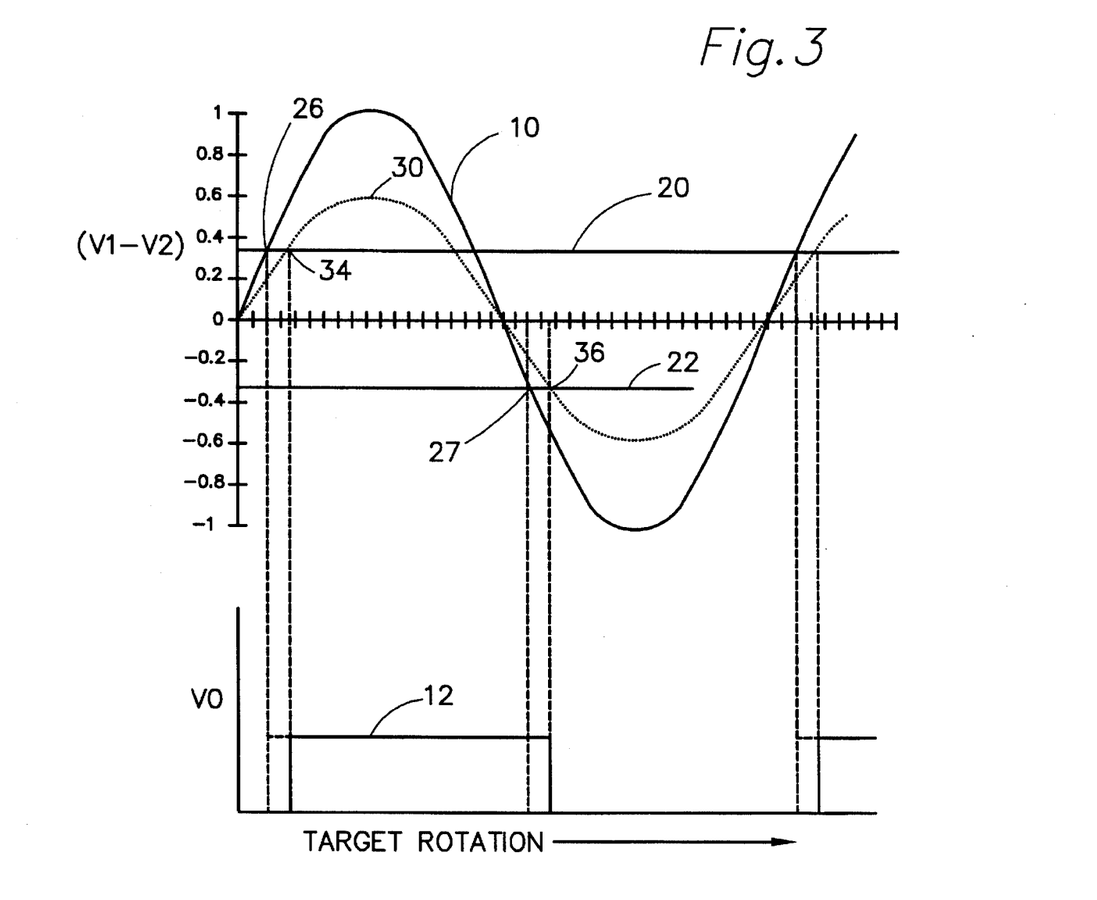
FIG. 3 shows the possible changes in the difference between first and second input signals as a function of changes in temperature.

FIG. 3 illustrates a problem that can occur in the operation of a geartooth sensor when the temperature of the sensor changes. The magnitude of the first and second input signals can be changed by changing ambient temperature and therefore the difference between those signals can also change as a function of temperature. FIG. 3 illustrates a hypothetical example of that type of change for the purpose of illustrating the adverse results that are possible. If, because of temperature changes, the difference between the first and second input voltages is defined by waveform 30, instead of waveform 10 as would be expected, the timing of the output signal V0 can be significantly affected. As can be seen in FIG. 3, the magnitude of waveform 30 does not exceed the first threshold magnitude 20 until it reaches point 34. Therefore, the temperature effect seen by comparing waveforms 10 and 30 changes the timing of the initiation of output signal V0 from point 26 to point 34. Similarly, the termination of the output signal V0 changes from point 27 to point 36. If the geartooth sensor is used for the purpose of facilitating the timing of an internal combustion engine, the result shown in FIG. 3 can be severely deleterious to the proper operation of the engine. The change from waveform 10 to waveform 30 can be caused by changes in temperature of the geartooth sensor.

Figure 4:
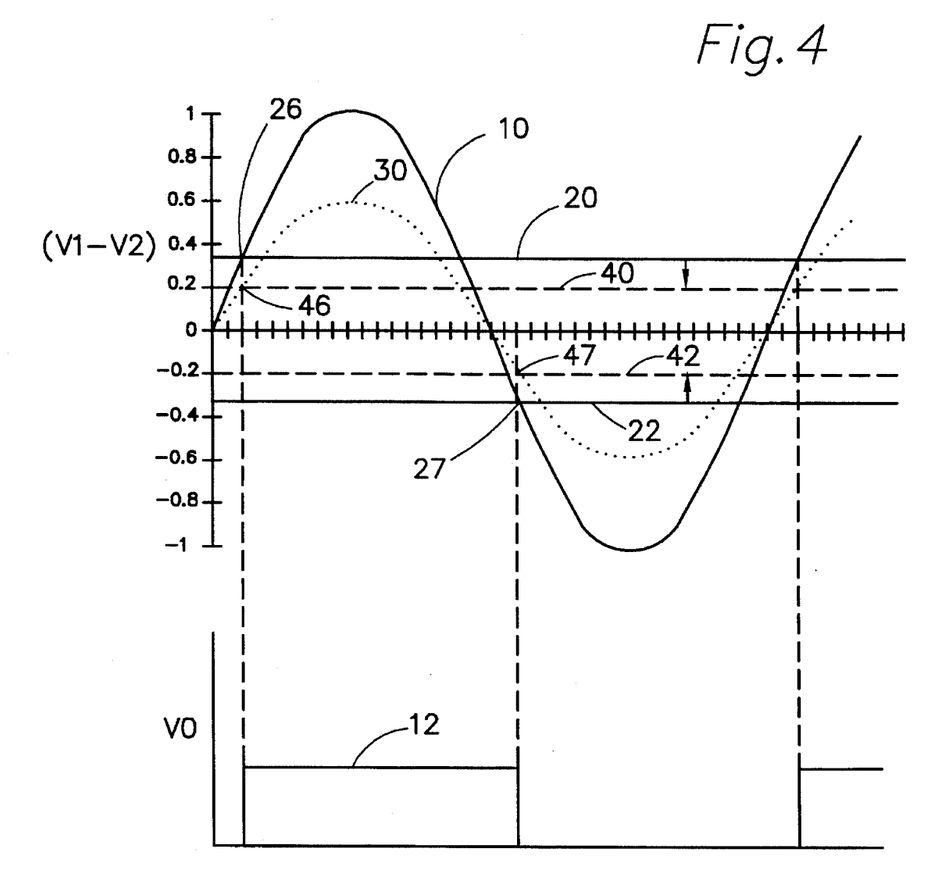
FIG. 4 shows the results of a temperature compensation circuit, such as the present invention, which changes the hysteresis of the circuit in response to changes in temperature.

FIG. 4 illustrates waveforms 10 and 30 and first and second threshold magnitudes, 20 and 22. FIG. 4 also illustrates a possible solution to the problem of temperature change that is described above in conjunction with FIG. 3. If, when temperature causes the difference in the first and second input voltages, V1 and V2, to change from waveform 10 to waveform 30, the first and second threshold magnitudes, 20 and 22, are similarly changed from their original magnitudes to those identified by reference numerals 40 and 42, the change in the difference between the first and second input voltages will not adversely affect the timing of the output signal V0. Waveform 30 crosses the adjusted first threshold magnitude 40 at point 46 which is at the same angular position as point 26. Similarly, waveform 30 crosses the second threshold magnitude 42 at point 47 which is at the same angular position as point 27. As can be seen in FIG. 4, a proper change in the first and second threshold magnitudes in response to changes in temperature can offset the effects that would otherwise be caused by the shift from waveform 10 to waveform 30. If the change in the first and second threshold magnitudes can be coordinated, as a function of temperature, to coincide with the change in the difference between the first and second input signals, as represented by waveforms 10 and 30, the timing of the output signal 12 can be held relatively constant and the adverse effects on the operation of the internal combustion engine can be minimized.

Figure 5:
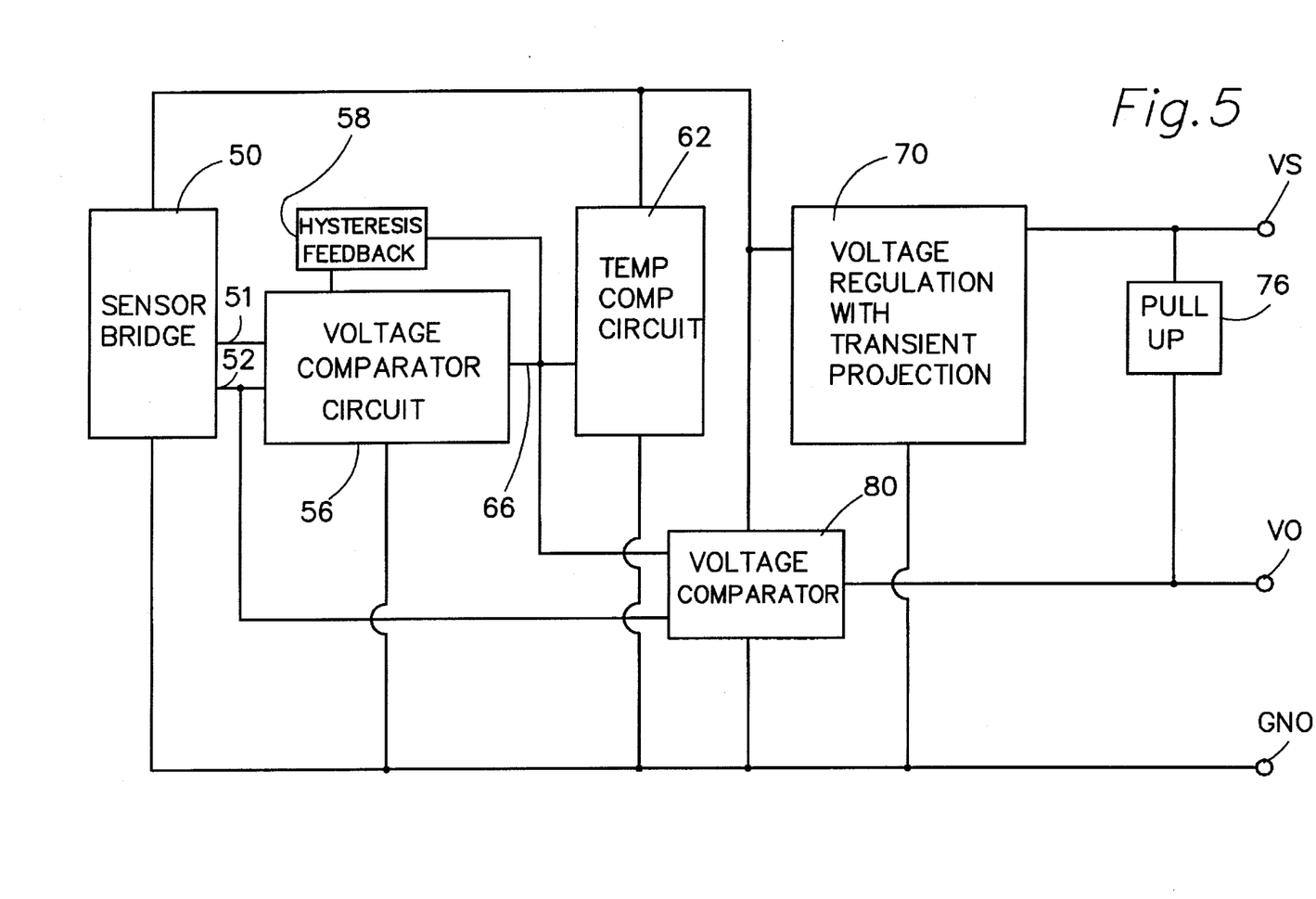
FIG. 5 is a schematic representation of the present invention associated with a sensor bridge.

FIG. 5 illustrates an exemplary schematic diagram of a circuit that incorporates the concepts of the present invention. A sensor bridge 50 provides first and second input signals, on lines 51 and 52, to a voltage comparator circuit 56. The voltage comparator circuit is provided with a hysteresis feedback 58 that can be a feedback resistor as will be described in greater detail below.

With continued reference to FIG. 5, a temperature compensation circuit 62 provides a voltage, on line 66, which varies as a function of temperature and permits the voltage comparator circuit to apply varying criteria to its comparison of the first and second input voltages received on lines 51 and 52 from the sensor bridge 50.

A voltage regulation circuit 70 is provided so that the temperature compensation circuit 62, the voltage comparator 56 and the sensor bridge 50 will have a constant and predictable voltage supply. Although many different types of known regulators can be used in conjunction with the present invention, a particularly preferred embodiment of the present invention incorporates a regulator that can provide a selected voltage to the circuit and can also withstand reverse connection that may occasionally occur in automotive applications. The circuit shown in FIG. 5 also provides a pull-up capability 76. A supply voltage VS and a ground connection GND are provided to the circuit and the operation of the present invention provides an output signal V0 that is generally similar to that which was described above in conjunction with FIGS. 1 and 4. A voltage comparator 80 is used to compare the magnitude of the voltage on line 66 with the voltage on line 52 and thereby provide an output signal V0 that is similar to that identified by reference numeral 12 in FIGS. 1 and 4. It should be understood that the schematic illustration in FIG. 5 is a simplified representation of the present invention.

Figure 6:
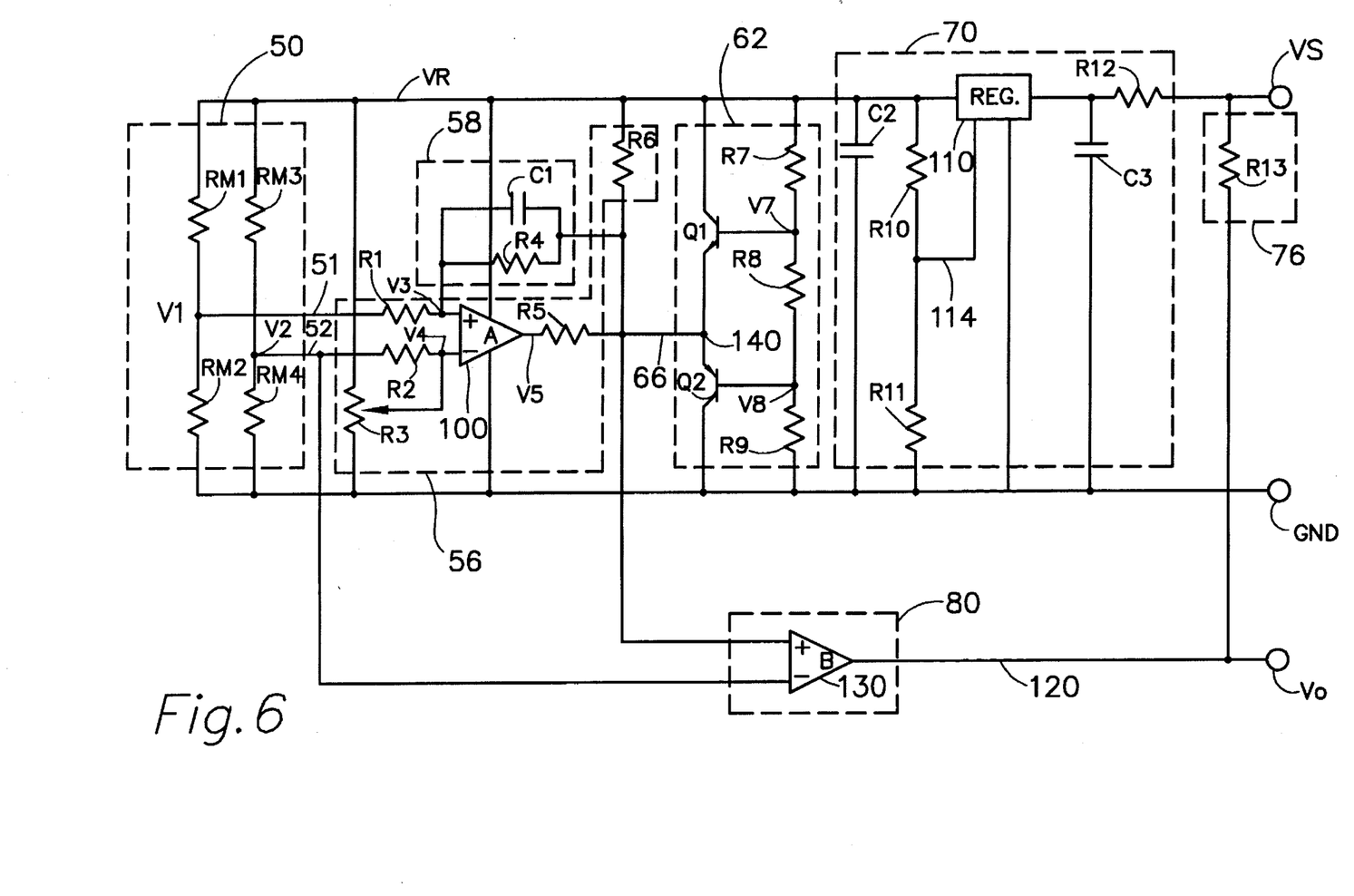
FIG. 6 is a detailed schematic of the present invention associated with a sensor bridge.

FIG. 6 illustrates one particularly preferred embodiment of the present invention. A voltage comparator circuit 56 receives a first input signal on line 51 and a second input signal on line 52. In the particular circuit shown in FIG. 6, the first input signal V1 and the second input signal V2 are taken from points on the first and second legs of a Wheatstone bridge configuration. The sensor bridge 50 comprises four magnetoresistors, RM1, RM2, M3 and RM4. The first input signal V1 is taken at a point between the first and second magnetoresistors and the second input signal V2 is taken at a point between the third and fourth magnetoresistors. Although the present invention will be described in conjunction with a Wheatstone bridge arrangement of four magnetoresistors, it should be understood that many different alternative sources of the first and second input signal could be used. The first and second input signals are connected, through resistors R1 and R2, to the noninverting input and inverting input of a first comparator 100, respectively. The voltages at the inputs of the first comparator 100 are identified as voltage V3 and voltage V4. The output of the first comparator 100 is identified as voltage V5 which is connected, through resistor R5, to line 66. A feedback resistor R4 is connected between the noninverting input of the first comparator and its output. The capacitor C1 is combined with the feedback resistor R4 for the purpose of increasing switching noise immunity. The temperature compensation circuit 62 comprises a first transistor Q1 and a second transistor Q2. It also comprises three resistors, R7, R8 and R9, that are combined to provide a voltage divider circuit between the regulated voltage VR and a point GND of ground potential. The three resistors of the voltage divider provide the first and second transistors with their base voltages, V7 and V8, respectively. Because the resistors of the voltage divider are not temperature sensitive, voltages V7 and V8 do not vary as a function of changing temperature. In the embodiment shown in FIG. 6, the first and second transistors, Q1 and Q2, are NPN and PNP transistors, respectively, and their emitters are connected together at point 140.

As can be seen in FIG. 6, the output of the first comparator 100 is connected to each of the emitters of the first and second transistors through resistor R5. With reference to the voltage regulation circuit 70, a regulator 110 is connected to the supply voltage VS and, by proper selection of resistors R10 and R11, a voltage potential on line 114 can select the desirable regulated voltage output VR. Capacitor C3 is provided for supply voltage transient filtering. Pull-up resistor R13 is connected between the supply voltage VS and the line 120 on which the output voltage V0 is provided.

The voltage comparator 80 comprises a second comparator 130 which has its noninverting input connected to line 66 and its inverting input connected to line 52. In order to explain the operation of the present invention in greater detail, particular sections of the circuit shown in FIG. 6 will be described individually below.

It should be understood that the first comparator 100 can experience two basic conditions. First, the voltage V3 can be less than voltage V4 at its inverting input. Under the second possible condition, the voltage V3 can exceed voltage V4 at the inverting input. Each of these possible conditions will be described separately below.

Figure 7:
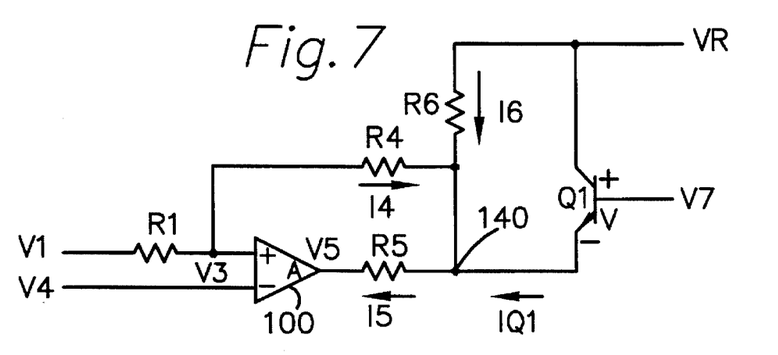
FIG. 7 is a portion of the circuit shown in FIG. 6.

FIG. 7 illustrates the situation when the voltage V3 is less than voltage V4. When this occurs, the output voltage V5 of the first comparator 100 is at its saturation voltage VSAT. Under this condition, voltage V5 is only slightly higher than ground potential and current I5 can flow through resistor R5 to the output of the first comparator 100. Current I6 flows from the regulated voltage source VR through resistor R6. Because of the relatively low magnitude of the voltage at point 140, which is essentially equivalent to the voltage drop across resistor R5, the voltage V3 will exceed the voltage at point 140. As a result, current I4 flows through resistor R4 in the direction as shown and the magnitude of voltage V3 is set by the voltage drops across resistors R4 and R5. The current IQ1 which flows through the first transistor Q1 is equal to the difference between currents I5 and I6 since the magnitude of resistor R4 is chosen to limit current I4 to that of a magnitude which is significantly less than current I6. Therefore, current IQ1 is defined by equation 1.

$$IQ1 = I5 - I6 = (V7 - VBE1 - VSAT)/R5 - (VR - V7 + VBE1)/R6 \quad (1)$$

The base-emitter voltage drop VBE1 of transistor Q1 changes as a function of temperature. This change with respect to temperature is well known to those skilled in the art and is a criterion that is accurately predictable.

With continued reference to FIG. 7, it can be seen that if voltage V7 is constant and not affected by temperature change while the base-emitter voltage drop of the first transistor Q1 decreases as temperature rises, the voltage at point 140 will also increase. As a result, current I4 will decrease. As a result of the decrease in current I4, the magnitude of voltage V3 will increase. This variation of the base-emitter voltage VBE1 of the first transistor Q1 therefore has the effect of increasing the second threshold magnitude 22 described above in conjunction with FIG. 4. As is generally known to those skilled in the art, the base-emitter voltage drop of a transistor changes at the rate of approximately minus two millivolts per degree centigrade. This characteristic is advantageously used to change the threshold magnitudes of a voltage comparison circuit such as that illustrated in FIG. 6.

With reference to FIG. 6, it can be seen that when the magnitude of the voltage at point 140 decreases, the first transistor Q1 is placed in a conducting state while the second transistor Q2 is reversed biased by the relative magnitudes of voltage V8 and the voltage at point 140. This condition exists when the first comparator 100 experiences a voltage V3 that is less than voltage V4 and the output voltage V5 is approximately at ground potential. The other condition of the first comparator 100 described above is when the voltage V3 is greater than voltage V4. That condition is illustrated in FIG. 8.

When the voltage V3 is greater than voltage V4, the first comparator is placed in a nonconducting state and its output is effectively disconnected from the remaining portions of the circuit. When this occurs, the voltage at point 140 rises and the first transistor Q1 is reverse biased and placed in a nonconducting condition. This occurs because the emitter voltage of the first transistor Q1 rises and turns the first transistor off. This voltage, at point 140 and at the emitter of the second transistor Q2, rises to a magnitude, in comparison to voltage V8, which is sufficient to place the second transistor Q2 in a conducting state. Since voltage V8 is fixed by the voltage divider, the voltage at the emitter of the second transistor Q2 is equal to voltage V8 plus the base-emitter voltage drop VBE2 of the second transistor Q2. Because the voltage at point 140 exceeds voltage V3, current flows through resistor R4 in a direction from right to left in FIG. 6. If the base-emitter voltage VBE2 of the second transistor Q2 changes as a function of temperature, this change can be used to affect the magnitude of the voltage at point 140 and determine the current I4 flowing through resistor R4. If temperature rises and the base-emitter voltage drop VBE2 decreases as a function of the rising temperature, current I4 decreases.

Figures 8, 9:
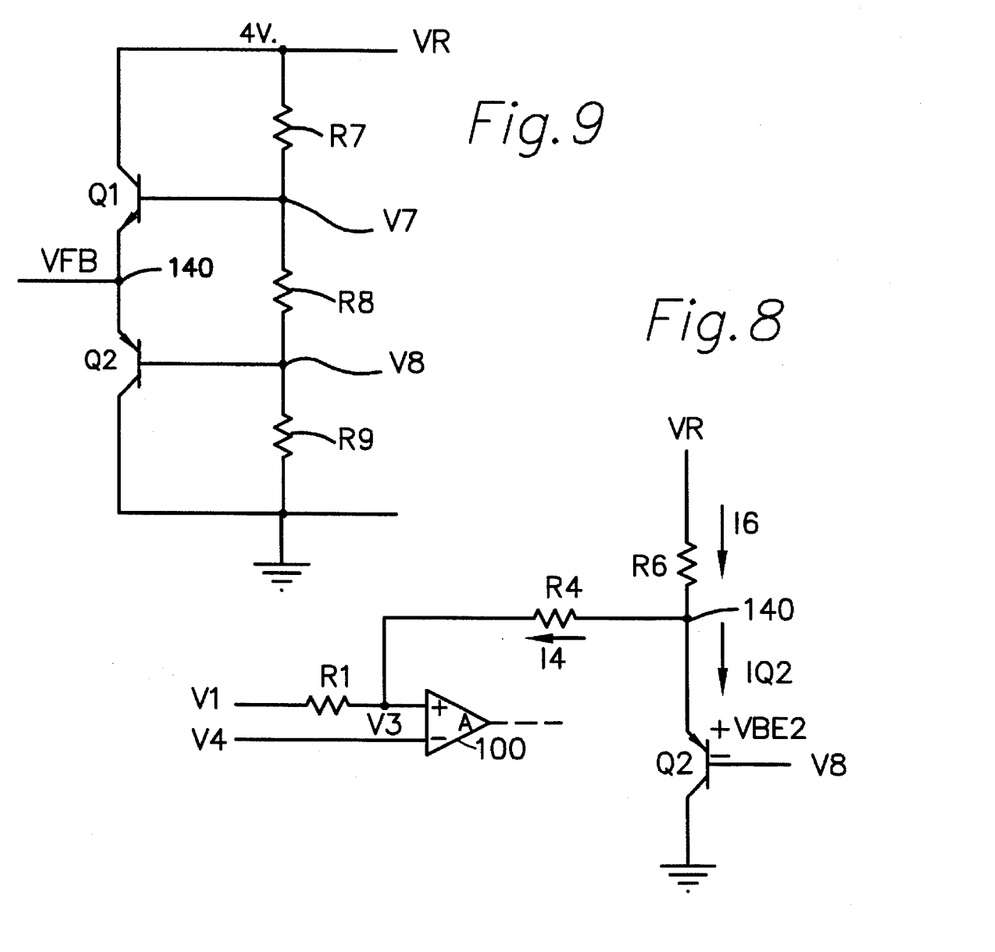
FIG. 8 is a portion of the circuit shown in FIG. 6.
FIG. 9 is a portion of the circuit shown in FIG. 6.

FIG. 9 shows the portion of the circuit in FIG. 6 that provides the constant voltages, V7 and V8, at the bases of the first and second transistors, Q1 and Q2. Since resistors R7, R8 and R9 are not temperature sensitive, voltages V7 and V8 are constant and not affected by changing temperature. Therefore, the voltage at point 140 is affected only by the change in either the base-emitter voltage drop VBE1 of transistor Q1 or the base-emitter voltage drop VBE2 of the second transistor Q2, whichever is in a conducting state. Because of the arrangement of the first and second transistors and because of the voltage magnitudes provided at various points in the circuit, the first and second transistors will not be in a conducting state at the same time. The first transistor Q1 will be in a conducting state when the signal V3 is less than voltage V4 and the second transistor Q2 will be in a conducting state when the signal V3 is greater than voltage V4. As a result of the configurations shown in FIGS. 7, 8 and 9, the voltage magnitude at point 140 will be determined solely by the base-emitter voltage drop, either VBE1 or VBE2, of the transistor which is in a conducting state relative to voltage V7 or V8, respectively.

Figure 10:
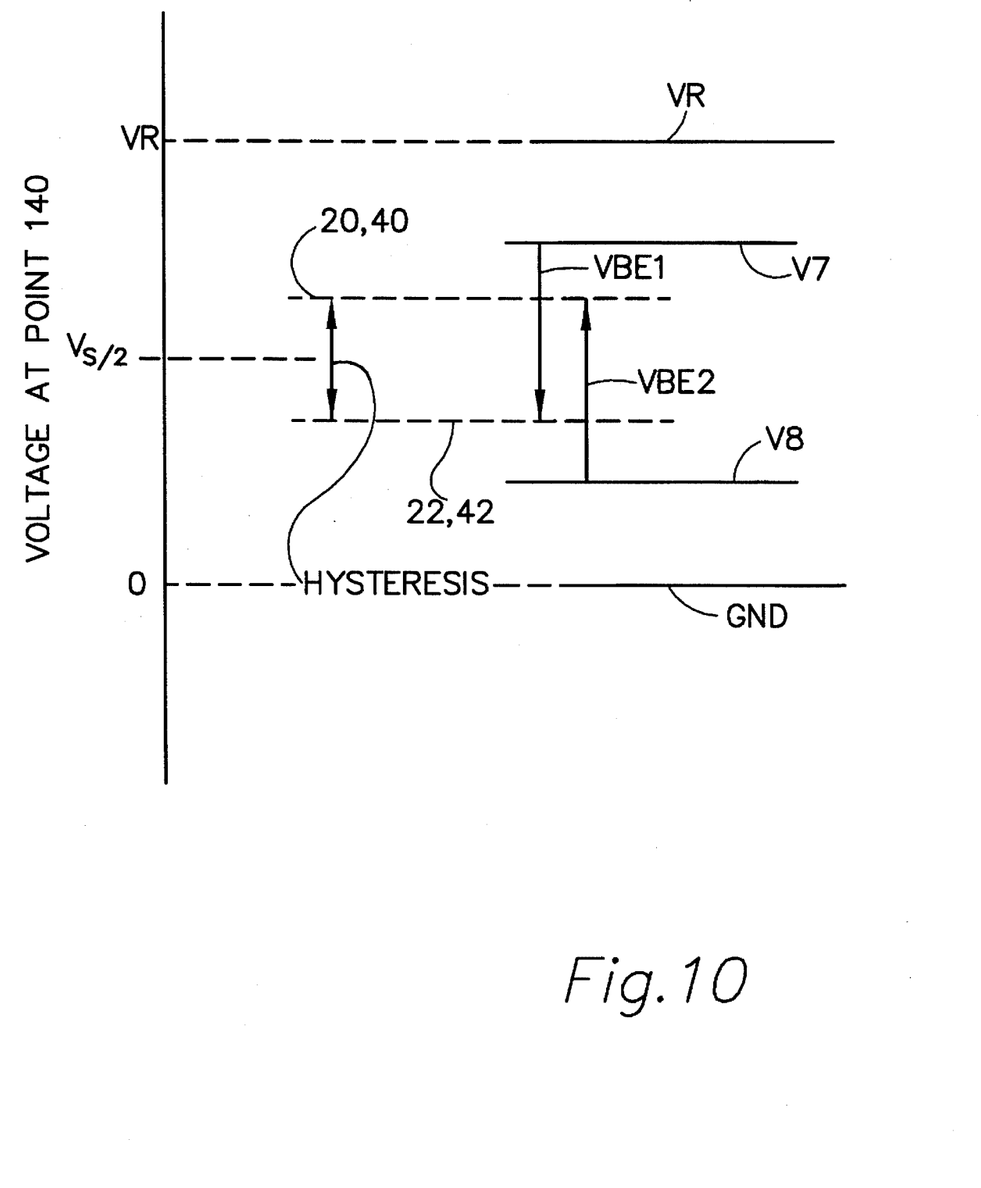
FIG. 10 is a representation of the relative voltage magnitudes of various points in the circuit of FIG. 6.

FIG. 10 is a schematic illustration of the various voltage magnitudes at point 140 of the circuit shown in FIGS. 6, 7, 8 and 9. As can be seen, a first reference point is shown at the regulated voltage magnitude VR and a second reference point is shown at ground potential GND. The voltage divider, which comprises resistors R7, R8 and R9, is used to define voltage V7 and voltage V8 which are a function of resistors R7 and R9 in association with resistor R8. Since voltages V7 and V8 do not vary as a function of temperature, they remain fixed across the entire temperature range of the device. However, the base-emitter voltages of the first and second transistors, Q1 and Q2, change as a function of temperature. As the temperature of the transistors increases, their base-emitter voltage drops decrease at an accurately predefined rate. Because of the arrangement of the circuit shown in FIG. 6, a decrease in the base-emitter voltage drop VBE1 of the first transistor will cause the second threshold magnitude (identified by reference numerals 22 and 42 in FIG. 10) to rise. Similarly, increasing temperature will decrease base-emitter voltage VBE2 and cause the first threshold magnitude (identified by reference numerals 20 and 40 in FIG. 10) to decrease. Therefore, increasing temperature will decrease the first threshold magnitude and increase the second threshold magnitude to result in the effect described above in conjunction with FIG. 4. By appropriately selecting the magnitudes of the various components shown in FIG. 6, the decrease in the difference between the first and second threshold magnitudes can be coordinated with the change from waveform 10 to waveform 30 as a function of temperature.

Although many alternative embodiments of the present invention are within its scope, a particularly preferred embodiment includes components of the types and magnitudes identified in Table 1 shown below.

TABLE I

| REFERENCE | VALUE OR TYPE |
|---|---|
| C1 | 330 picofarads |
| C2 | 50 microfarads |
| C3 | 0.1 microfarads |
| COMPA | ½ LM 193 |
| COMPB | ½ LM 193 |
| R1 | 5K Ω |
| R2 | 5K Ω |
| R3 | 200K Ω |
| R4 | 500K Ω |
| R5 | 1.62K Ω |
| R6 | 5K Ω |
| R7 | 3.3K Ω |
| R8 | 535 Ω |
| R9 | 3.3K Ω |
| R10 | 28K Ω |
| R11 | 65K Ω |
| R12 | 50 Ω |
| RM1 | MAGNETORESISTOR |
| RM2 | MAGNETORESISTOR |
| RM3 | MAGNETORESISTOR |
| RM4 | MAGNETORESISTOR |
| Regulator 110 | LM2931 (National Semiconductor) |

With reference to FIG. 6, resistor R3 permits the first and second input voltages, V1 and V2, to be set during the manufacture of a geartooth sensor or other type of sensor that incorporates the present invention in association with a Wheatstone bridge or other type of source of the first and second input voltages. Resistor R13 is used as a pull-up resistor for the second comparator 130. The regulator 110, in a particularly preferred embodiment of the present invention, is selected to be capable of withstanding reverse battery hookup voltages for automotive applications. Resistors R10 and R11 permit the regulated voltage output of regulator 110 to be adjusted.

With continued reference to FIG. 6, it can be seen that the values of resistors R7, R8 and R9 can be selected to assure that the first and second transistors, Q1 and Q2, will not be placed in a conducting state simultaneously. When the first comparator 100 is conducting current to ground through resistor R5, the feedback voltage at point 140 is defined by equation 2.

$$VFB = V7 - VBE1 \tag{2}$$

As temperature increases, when the first transistor Q1 is conducting, the feedback voltage VFB at point 140 will increase since VBE1 decreases in response to increasing temperature. When the first comparator 100 is in a nonconducting state, resistor R6 will conduct current into the emitter of the second transistor Q2 and the feedback voltage VFB at point 140 will increase. This increase in the voltage at point 140 will place the first transistor Q1 in a nonconducting state and will set the feedback voltage VFB to the value determined by equation 3.

$$VFB = V8 + VBE2 \quad (3)$$

As temperature increases under this condition, the feedback voltage at point 140 will decrease since the base-emitter voltage drop of a transistor decreases at approximately 2 millivolts per degree Celsius.

The present invention therefore changes the hysteresis, or the difference between the first and second threshold magnitudes, in response to increasing temperature. The hysteresis magnitude is determined by the feedback voltage VFB at point 140 in the circuit of FIG. 6. The magnitude of the hysteresis is determined by the magnitude of the current I4 flowing through the feedback resistor R4. Current I4 is set by the value of resistor R4 and by the voltage across resistor R4. Therefore, in order to decreases the hysteresis as temperature increases, the voltage across R4 must decrease as temperature increases. The first and second threshold magnitudes have opposite current directions. Therefore, the voltage polarity across resistor R4 changes in response to changes in the relative magnitudes of the first and second input signals.

When the first comparator 100 is conducting current from point 140 to its output, the current flowing through the first transistor Q1 is defined by equation 1 above. When the first comparator 100 is in a nonconducting state, the current through the second transistor Q2 is defined by equation 4 below.

$$IQ2 = (VR - V8 - VBE2)/R6 \quad (4)$$

As can be seen from the above description, the present invention utilizes the second transistor Q2 to determine the first threshold magnitude and uses the first transistor Q1 to determine the second threshold magnitude. Because of the predictable change in the base-emitter voltage drop of these first and second transistors, the two threshold magnitudes can be caused to change and the hysteresis between them can therefore be changed as a function of temperature.

Although the present invention has been described with significant specificity and illustrated to particularly show one preferred embodiment of the present invention, it should be understood that alternative embodiments are also within its scope. For example, the present invention does not require the use of a Wheatstone bridge or the use of magnetoresistors. In addition, variations in the circuit configuration with regard to the voltage divider, the first and second transistors and the first comparator can be changed and still remain within the scope of the present invention.

The embodiments of the invention in which an exclusive property or right is claimed are defined as follows:

1. A circuit, comprising:
   first means for receiving a first input signal;
   second means for receiving a second input signal;
   means for determining a difference in magnitude between said first and second input signals;
   first means for comparing said difference in magnitude to a first threshold magnitude;
   second means for comparing said difference in magnitude to a second threshold magnitude;
   first means for providing a first output signal when said difference in magnitude is greater than said first threshold magnitude;
   second means for providing a second output signal when said difference in magnitude is less than said second threshold magnitude;
   means for decreasing said first threshold magnitude as a function of increasing temperature; and
   means for increasing said second threshold magnitude as a function of increasing temperature.

2. The circuit of claim 1, wherein:
   said determining means and said first and second comparing means comprise a first comparator.

3. The circuit of claim 1, wherein:
   said first and second providing means comprise a second comparator.

4. The circuit of claim 2, further comprising:
   a feedback resistor connected in electrical communication between an output and a noninverting input of said first comparator.

5. The circuit of claim 4, wherein:
   said decreasing means comprises a first transistor connected in signal communication with said feedback resistor.

6. The circuit of claim 5, wherein:
   said increasing means comprises a second transistor connected in signal communication with said feedback resistor.

7. The circuit of claim 6, wherein:
   the emitter of said first transistor is connected to the emitter of said second transistor, said feedback resistor being connected in signal communication with said emitters of said first and second transistors.

8. The circuit of claim 7, further comprising:
   a voltage divider connected between a voltage source and a point of ground potential, a base of said first transistor being connected to a first point of said voltage divider and a base of said second transistor being connected to a second point of said voltage divider.

9. The circuit of claim 1, further comprising:
   four magnetoresistors connected in a Wheatstone bridge arrangement, said first input signal being taken from a first leg of said bridge and said second input signal being taken from a second leg of said bridge.

10. The circuit of claim 9, wherein:
    said four magnetoresistors are made of permalloy material.

11. A circuit, comprising:
    first means for receiving a first input signal;
    second means for receiving a second input signal;
    means for determining a difference in magnitude between said first and second input signals;
    first means for comparing said difference in magnitude to a first threshold magnitude;
    second means for comparing said difference in magnitude to a second threshold magnitude, said determining means and said first and second comparing means comprising a first comparator;
    first means for providing a first output signal when said difference in magnitude is greater than said first threshold magnitude;
    second means for providing a second output signal when said difference in magnitude is less than said second threshold magnitude, said first and second providing means comprising a second comparator;
    means for decreasing said first threshold as a function of increasing temperature;
    means for increasing said second threshold as a function of increasing temperature; and
    a feed back resistor connected in electrical communication between an output and a noninverting input of said first comparator.

12. The circuit of claim 11, wherein:

said decreasing means comprises a first transistor connected in signal communication with said feedback resistor.

13. The circuit of claim 12, wherein:

said increasing means comprises a second transistor connected in signal communication with said feedback resistor.

14. The circuit of claim 13, wherein:

the emitter of said first transistor is connected to the emitter or said second transistor, said feedback resistor being connected in signal communication with said emitters of said first and second transistors.

15. The circuit of claim 14, further comprising:

a voltage divider connected between a voltage source and a point of ground potential, a base of said first transistor being connected to a first point of said voltage divider and a base of said second transistor being connected to a second point of said voltage divider.

16. The circuit of claim 11, further comprising:

four magnetoresistors connected in a Wheatstone bridge arrangement, said first input signal being taken from a first leg of said bridge and said second input signal being taken from a second leg of said bridge.

17. The circuit of claim 16, wherein:

said four magnetoresistors are made of permalloy material.

18. A circuit, comprising:

four magnetoresistors connected together to form a Wheatstone bridge, said bridge providing first and second input signals;

a first comparator having said first input signal connected to its noninverting input and said second input signal connected to its inverting input;

a feedback resistor connected in electrical communication between an output of said first comparator and said noninverting input of said first comparator;

first and second transistors connected together, said output of said first comparator being connected in electrical communication with a circuit point between said first and second transistors, said first and second transistors both having base emitter voltage drops which vary inversely as a function of temperature;

a voltage divider comprising three resistors, the bases of said first and second transistors being connected to first and second points, respectively, of said voltage divider; and a second comparator having an input connected in electrical communication to said output of said first comparator, an output of said second comparator providing an output signal representing the relative magnitudes of said first and second input signals.

19. The circuit of claim 18, wherein:

said first transistor is an NPN transistor and said second transistor is a PNP transistor.

20. The circuit of claim 19, wherein:

the emitters of said first and second transistors are connected together.

* * * * *